United States Patent [19]

Sakakibara et al.

[11] Patent Number: 4,819,037

[45] Date of Patent: Apr. 4, 1989

[54] SEMICONDUCTOR DEVICE

[75] Inventors: Nobuyoshi Sakakibara; Mitutaka Katada, both of Nishio; Minoru Ohta, Okazaki; Tadashi Hattori, Okazaki; Takayuki Tominaga, Okazaki, all of Japan

[73] Assignee: Nippon Soken, Inc., Nishio, Japan

[21] Appl. No.: 57,027

[22] Filed: Jun. 3, 1987

[30] Foreign Application Priority Data

Jun. 5, 1986 [JP]   Japan .................................. 61-130518

[51] Int. Cl.$^4$ ............................................. H01L 27/12
[52] U.S. Cl. ........................................ 357/4; 357/67; 357/49; 357/23.7; 357/23.4
[58] Field of Search ................... 357/49, 4, 23.7, 67 S, 357/23.4

[56] References Cited

U.S. PATENT DOCUMENTS 4,685,199  8/1987  Jastrzebski ........................... 357/49
4,748,485  5/1988  Vasudev ................................. 357/4

FOREIGN PATENT DOCUMENTS 59-181636 10/1984 Japan .................................. 357/67 S
60-187055  9/1985 Japan .................................. 357/43

OTHER PUBLICATIONS

IEE Transactions on Electron Devices, vol. Ed-27, No. 2, Feb. 1980, "Modeling of the On-Resistance of LDMOS, VDMOS, and VMOS Power-Transistors", S. C. Sunn and James D. Plummer, pp. 356-367.

Primary Examiner—Martin H. Edlow
Assistant Examiner—Mark Prenty
Attorney, Agent, or Firm—Cushman, Darby & Cushman

[57] ABSTRACT

In a semiconductor device having mainly vertical semiconductor elements, a plurality of semiconductor elements are formed in spaced relationship from each other on an insulation layer formed on a substrate and therefore completed isolated electrically from each other. A plurality of semiconductor intermetallic compound layers used as electrodes are formed independently in the same spaced relationship as the semiconductor elements for the respective semiconductor elements, making it possible to determine the potential for each semiconductor element as desired. Both N-type DMOS and P-type DMOS or the like can thus be formed on a single seminconductor single crystal substrate.

13 Claims, 5 Drawing Sheets

SEMICONDUCTOR DEVICE

BACKGROUND OF THE INVENTION

1. Field of the Invention

The present invention relates to a semiconductor device, or more in particular to a semiconductor device in which a plurality of semiconductor elements of various types are formed in electrically insulated relations with each other on an insulating layer.

2. Description of the Related Art

The power MOS transistor which is a kind of semiconductor has various features. First, it has a high input impedance and a large current gain. Secondly, it is capable of high-speed operation. Thirdly, its operation is stable against thermal effect. For these features, the transistor is expected to find wide applications to a large-power switching device or the like. The vertical double-diffused MOS transistor (hereinafter referred to as "DMOS"), which is a kind of power MOS transistor, has a superior breakdown voltage and high-frequency characteristic as semiconductor elements. A perspective sectional view of a conventional structure of such a DMOS is shown in FIG. 6.

In the conventional structure shown in FIG. 6, an N+-type silicon single-crystal substrate connected to a drain 100 and an N−-type epitaxial layer 102 lower in impurities concentration than the silicon single-crystal substrate 101 and laid on the top of the silicon single-crystal substrate 101, make up a drain region. A P-type well region 103 is formed in the N−-type epitaxial layer 102. Further, the P-type well region 103 has formed therein an N+-type source region 104 electrically connected to a source 107. In the next, a gate electrode layer 105 is formed in an interlayer insulating film 106 formed to cover both the N+-type source region 104 and the N−-type epitaxial layer 102, and after that, the source 107 is so formed that the DMOS should be configured as a result.

In FIG. 6, a hatched arrow indicates the direction of currents that flow in the case where the drain 100 is impressed with a positive potential, the N+-type source 104 and the P-type well region 103 are grounded, and the gate electrode layer 105 is supplied with the required potential.

The above-described conventional DMOS structure is such that the drain 100 is connected to the whole reverse surface of the silicon single-crystal substrate 101, and is shared by all the semiconductor elements on the substrate 101. As a result, it is impossible to configure a DMOS of N-type channel and a DMOS of P-type channel on the same semiconductor substrate.

On the other hand, a complementary circuit or the like which has the functions of horizontal MOS transistors of both P-type and N-type channels such as CMOS has been conventionally suggested. In such a circuit, electrical isolation between semiconductor elements is effected by a PN junction, so that it is always necessary to reversely bias the semiconductor substrate or the well region against the PN junction. Also, the elements are liable to be broken by a latch-up. Another problem is that if the device is operated at about the PN junction breakdown temperature Tj (=150° C.), the leak current increases, thereby reducing the reliability.

SUMMARY OF THE INVENTION

The object of the present invention is to provide a semiconductor device in which a plurality of semiconductor elements of various types including DMOS of N- and P-type channels are formed in complete electrical isolation from each other on the same substrate, and having such a configuration as to reduce the effect of a latch-up or a leak current under high-temperature operation.

A semiconductor device according to the present invention comprises a substrate, a plurality of semiconductor single-crystal layers partially formed through insulating layers on the main surface of the substrate and in spatially isolated relationship with each other, a plurality of single-crystal semiconductor intermetallic compound layers formed on the semiconductor single-crystal layers respectively and used as electrodes for semiconductor elements, and a plurality of semiconductor epitaxial layers formed on the semiconductor intermetallic compound layers, which are used as active layers for the semi conductor elements.

According to the above configuration, if semiconductor elements are formed in and on the semiconductor epitaxial layers, the respective semiconductor elements are completely isolated electrically by insulating layers as desired. Also, in view of the fact that semiconductor intermetallic compound layers are used as electrodes of the semiconductor elements which are electrically independent of each other, it is possible to form a DMOS of N-type channel and a DMOS of P-type channel on the same substrate as desired.

DESCRIPTION OF THE PREFERRED EMBODIMENTS

An embodiment of the present invention will be explained in detail below with reference to the drawings.

Figure 1:
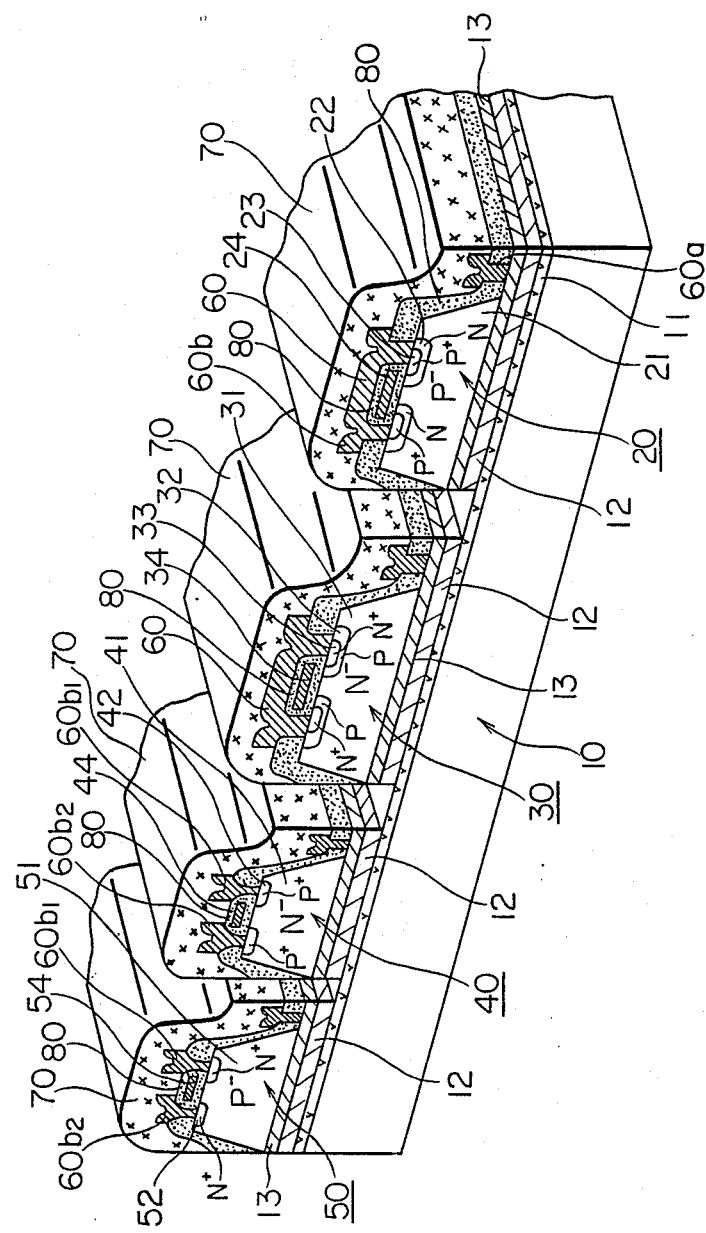
FIG. 1 is a perspective sectional view of a semiconductor device according to an embodiment of the present invention.

FIG. 1 is a perspective sectional view f an embodiment in which a semiconductor according to the present invention is applied to an intelligent power device including semiconductor elements for a control circuit. In FIG. 1, reference numeral 10 designates a silicon single-crystal substrate. The main surface of the silicon single-crystal substrate 10 is implanted with oxygen ions by the SIMOX (Separation by Implanted Oxygen) process or selectively anodized by the FIPOS (Full Isolation Technology by Porous Oxidized Silicon) process. The SIMOX and FIPOS processes will be described later herein. By these processes, a silicon oxide layer 11 is formed between the single-crystal substrate 10 providing a base and the silicon single-crystal layer 12 left on the main surface of the silicon single-crystal substrate 10. In the embodiment shown in FIG. 1, the SIMOX process was used. In the shown example, the silicon single-crystal layer 12 is shown as selectively removed by etching or the like as described later. A predetermined space is set between each adjacent two of a plurality of silicon single-crystal layers 12 left unetched.

A metal silicide layer 13 is formed by heteroepitaxial growth of a single crystal of a silicon-metal compound through the MBE (Molecular Beam Epitaxy) process or the like on each silicon single-crystal layer 12. It is known that a metal silicide layer 13 of higher quality is obtained by employing a material with a crystal structure and a lattice constant close to those of silicon. Desirable materials include, for example, cobalt silicide ($CoSi_2$) or nickel silicide ($NiSi_2$) having a crystal structure like calcium fluoride ($CaF_2$). Epitaxial layers 21, 31, 41 and 51 are further formed on the metal silicide layer 13. The conduction type of the epitaxial layers 21, 31, 41 and 51 is arbitrarily adjusted by changing the dopant material. In the embodiment under consideration, for instance, the epitaxial layer 21 for forming a DMOS of P-channel type (hereinafter referred to as "P-DMOS") 20 as a semiconductor element for large power is of $P^-$-type, and the epitaxial layer 31 for forming a DMOS of N-type channel (hereinafter referred to as "N-DMOS") 30 is of $N^-$-type. Also, the epitaxial layer 41 for forming a horizontal MOS transistor of P-type channel (hereinafter referred to as "P-MOS") 40 as a semiconductor element for a control circuit is of $N^-$-type, and the epitaxial layer 51 for forming a horizontal MOS transistor of N-type channel (hereinafter referred to as "N-MOS") 50 is of $P^-$-type By a well-known method of fabrication, an N-type diffusion layer 22 and $P^+$-type diffusion layer 23 are formed by double diffusion in the epitaxial layer 21, and a gate electrode layer 24 is formed through an interlaminar insulating film 80 on the epitaxial layer 21. Also, an aluminum wiring 60a is formed electrically connected to the metal silicide layer 13, and an aluminum wiring 60b formed similarly electrically connected to the $P^+$-type diffusion layer 23. A passivation film 70 is formed on the interlayer insulating film 80 and the aluminum wirings 60a and 60b. In the P-DMOS 20, the aluminum wiring 60b is a source, and the aluminum wiring 60a (metal silicide layer 13) a drain. In similar fashion, in the N-DMOS 30, a P-type diffusion layer 32 and an $N^+$-type diffusion layer 33 are formed by double diffusion in the epitaxial layer 31, and a gate electrode layer 34 is formed through the interlaminar insulating film 80. In FIG. 1, the same component parts of N-DMOS 30 as those of P-DMOS 20 are designated by the same reference numerals as comparable parts of P-DMOS 20 and therefore will not be described again.

The epitaxial layer 40 has a $P^+$-type diffusion layer 42 formed therein, and gate electrode layer 44 is formed through the interlaminar insulating film 80 on the part of the $P^+$-type diffusion layer 42 which is adapted to provide a channel region thereof. The $P^+$-type diffusion layer 42 is electrically connected with the aluminum wirings $60b_1$ and $60b_2$, which provide a source and a drain respectively. In similar manner, in N-MOS 50, the epitaxial layer 51 has an $N^+$-type diffusion layer 52 formed therein, and a gate 54 is formed through the interlaminar insulating film 80. In FIG. 1, the same component parts of N-MOS 50 as those of P-MOS 40 are designated by the same reference numerals as those of comparable parts of P-MOS 40 respectively and will not be described again.

The above-mentioned semiconductor elements, which are formed on the silicon single-crystal layers 12, are isolated spatially from each other and electrically independent of each other as the elements.

Figure 2:
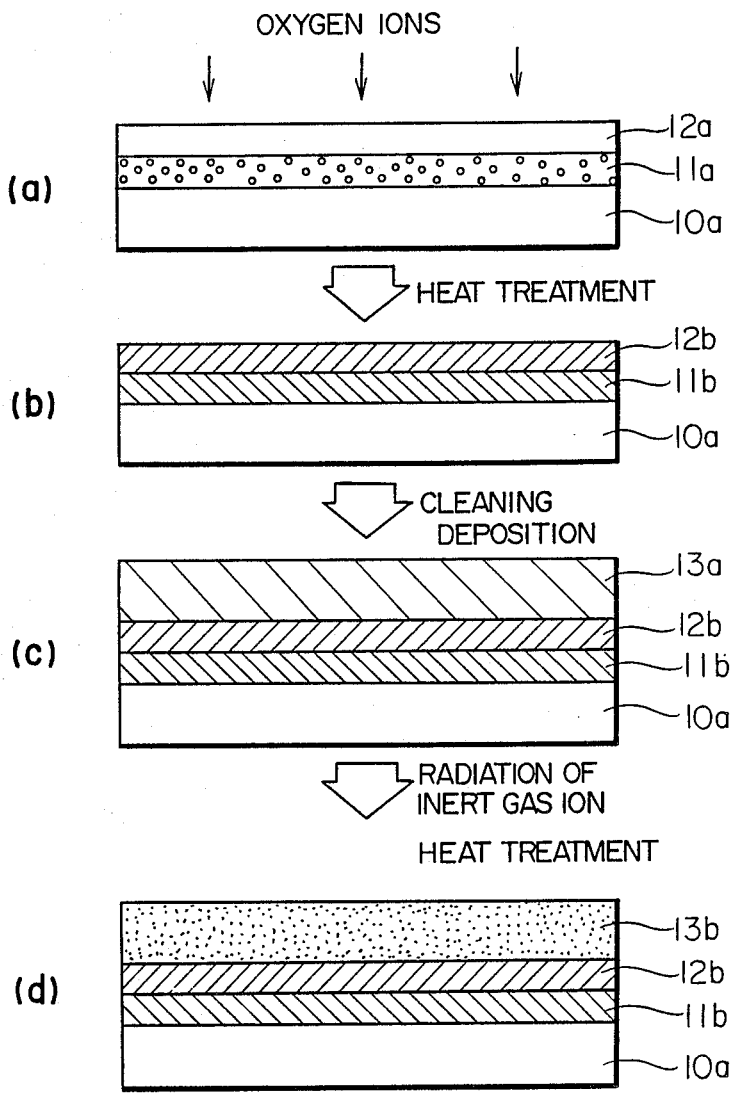
FIGS. 2 to 4 are sectional views of the parts for explaining the processes of forming the essential parts of the semiconductor device shown in FIG. 1.
Figure 3:
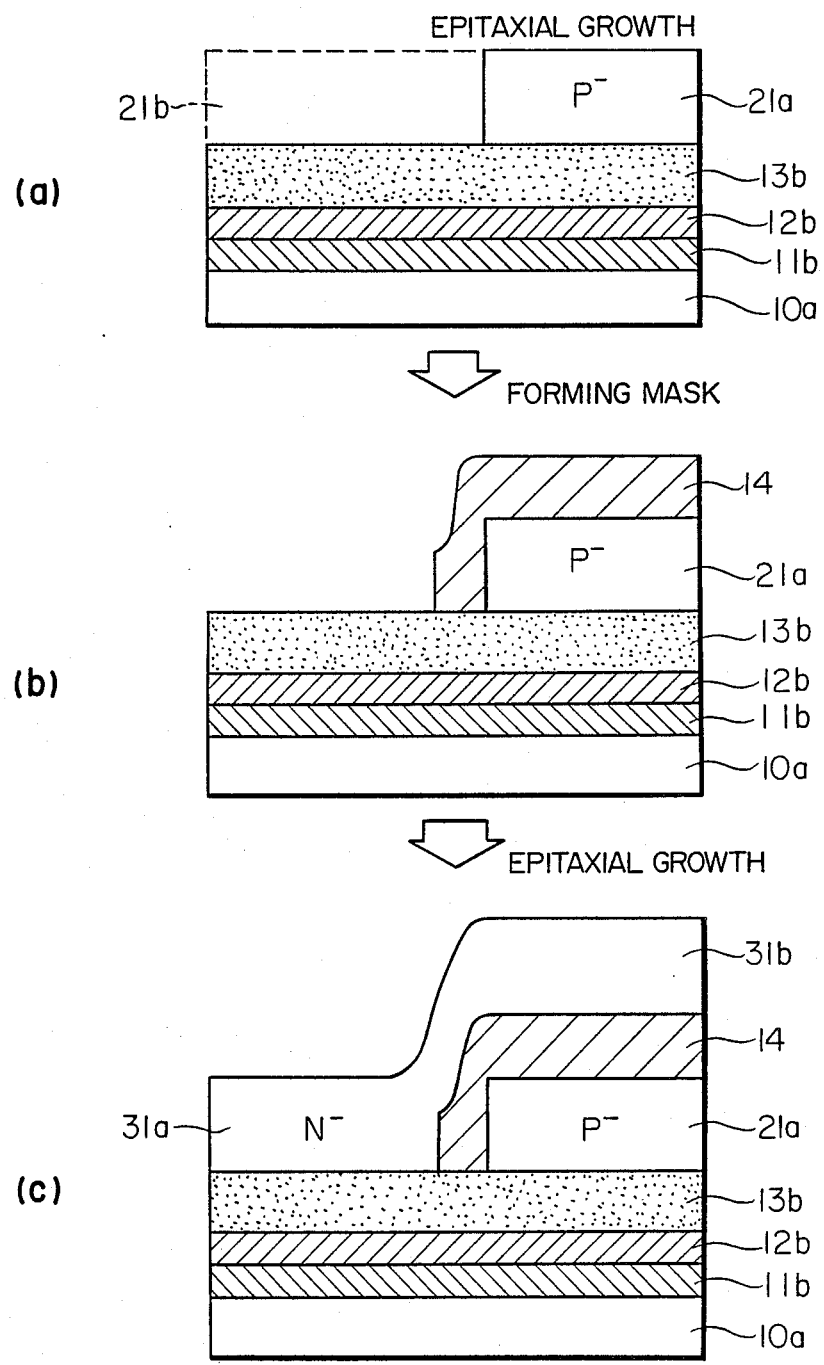
Figure 4:
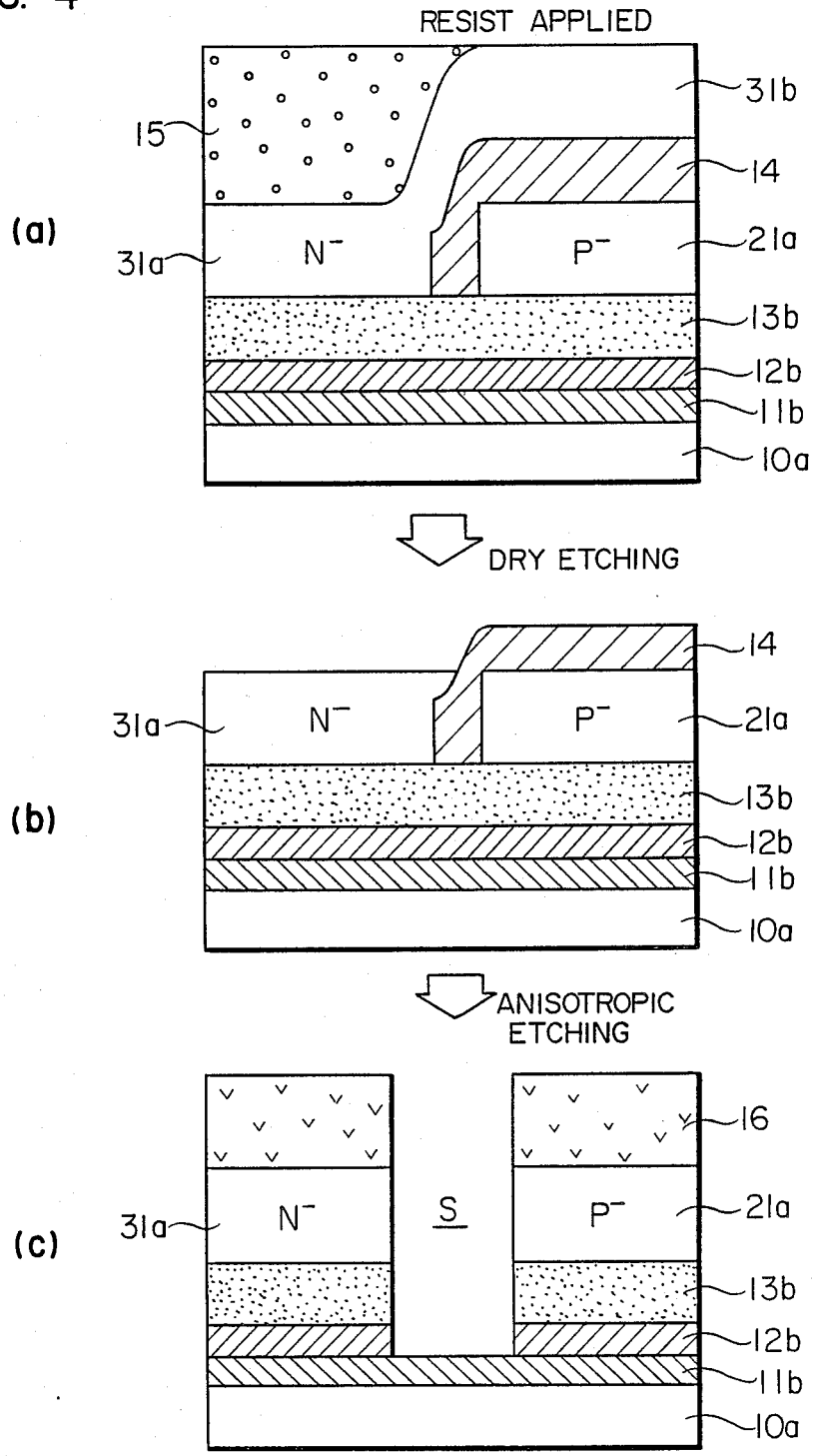

Next, with reference to FIGS. 2 to 4 showing essential parts of the semiconductor device, explanation will be made of the processes in which oxygen ions are implanted into the silicon single-crystal substrate by the SIMOX process and the essential parts of the semiconductor device according to the present invention is formed by the hetero-epitaxial process thereafter. First, as shown in FIG. 2(a), oxygen ions ($O^+$ or $O_2^+$) are injected by way of the main surface of the silicon single-crystal substrate 10a at a rate of about $10^{18}$ doses/cm$^2$ under an acceleration voltage of 70 to 200 KeV, thus forming three layers including the silicon single-crystal substrate 10a providing a base, a layer 11a injected with oxygen ions, and a silicon single-crystal substrate 12a on the main surface. After a heat treatment, as shown in FIG. 2(b), the layer 11a injected with oxygen ions is oxidized and converted into a silicon oxide layer 11b, while the silicon single-crystal substrate 12a restores from the damage of the ion implantation and becomes a silicon single-crystal layer 12b of good crystal property. Now, as shown in FIG. 2(c), the surface of the silicon single-crystal layer 12b is sufficiently washed into a clean state, after which a metal film of such material as cobalt or nickel, or a metal silicide layer 13a of such a material as cobalt silicide ($CoSi_2$) or nickel silicide ($NiSi_2$) is deposited on the surface of the silicon single-crystal layer 12b by use of the vacuum evaporation process, CVD (Chemical Vapor Deposition) process or MBE process. The metal film or metal silicide layer 13a may not be in a complete form of single crystal but polycrystal or microcrystal. In such a case, ions of an inert gas such as argon ($Ar^+$) are applied by ion implantation in the manner shown in FIG. 2(d) thereby to convert the metal silicide layer 13a or the metal film into an amorphous state. After that, the structure is subjected to a heat treatment to effect a hetero-epitaxial growth with the silicon single-crystal layer 12b as a silicon source or a seed, thus making it possible to produce a metal silicide layer 13b of a perfect single crystal.

In the next step, as shown in FIG. 3(a), an epitaxial layer 21a is formed on the metal silicide layer 13b by use of a method of growing epitaxial layer such as the vapor phase epitaxy (VPE). The impurities concentration of the epitaxial layer 21a is low, and the conduction type of this layer is P-type, for instance. The unrequired region 21b is removed by patterning or dry etching. In the manner shown in FIG. 3(b), a silicon oxide film ($SiO_2$) 14 or the like is formed as a masking material on a predetermined region thereby to cover the epitaxial layer 21a. Then, under this condition, as shown in FIG. 3(c), epitaxial layers 31a and 31b are formed with the metal silicide layer 13b as a seed again. The epitaxial layer 31a and 31b are N in conduction type, for instance. The epitaxial layer 31b on the silicon oxide film 14 is not in single crystal but polycrystal state.

In the next step, as shown in FIG. 4(a), a resist 15 made of a material with an etching rate substantially equal to that of the epitaxial layer 31b is applied on the epitaxial layer 31a for patterning. Under this condition, as shown in FIG. 4(b), dry etching is effected on the side of the epitaxial layer 31b and resist 15 in order to remove the epitaxial layer 31b. The residue of the silicon oxide film 14 is removed by an etching solution like hydrofluoric acid. This step of removing the residue of the silicon oxide film 14 may be eliminated if the epitaxial layer 31a is caused to grow only on the metal silicide layer 13b by applying a dopant gas such as HCl for selective epitaxial growth. As shown in FIG. 4(c), a resist 16 is formed on the epitaxial layers 21a and 31a for patterning, after which anisotropic etching is effected with RIE (Reactive Ion Etching) process or the like to form a slot S extending to the silicon oxide layer 11b.

After the resist 16 is removed, semiconductor elements are formed in and on the epitaxial layers 21a and 31a as described above thereby to fabricate a semiconductor device.

According to the above embodiment, the epitaxial layers 21a and 31a are grown separately from each other. As an alternative, after forming a P$^-$-type epitaxial layer 21a, N-type impurities are injected to form the epitaxial layer 31a by changing a predetermined region to N$^-$-type conductivity. The reference numerals 10a, 11b, 12b, 13b, 21a and 31a in FIG. 4(c) correspond to numerals 10, 11, 12, 13, 21 and 31 in FIG. 1 respectively.

In the semiconductor device of the above-mentioned configuration, the semiconductor elements 20, 30, 40 and 50 are formed in relations spaced by the slot S from each other on the silicon oxide layer 11 which is an insulation layer, and therefore are completely isolated electrically from each other. Also, since the metal silicide layers 13 are formed separately for each semiconductor layer, the each potential for the layers 13 may be determined as desired. Further, both P-DMOS and N-DMOS are capable of being formed on the same silicon single-crystal substrate 10, and a structure of an intelligent device is produced by including a complementary circuit with a D-MOS and other semiconductor elements for control circuits. Furthermore, since the silicon oxide layer 11 is used as a material for electrically isolating the semiconductor elements from each other, no latch-up occurs. In addition, since the silicon oxide layer 11 has a superior temperature characteristic against the leak current, the leak current can be reduced also under high-temperature operation.

The present invention is not confined to the embodiments explained above, but various modifications thereof are possible to the extent that the spirit of the invention is not departed from. For example, the oxide layer may be formed in a predetermined region in the semiconductor single-crystal substrate by using the FIPOS process described below.

Figure 5:
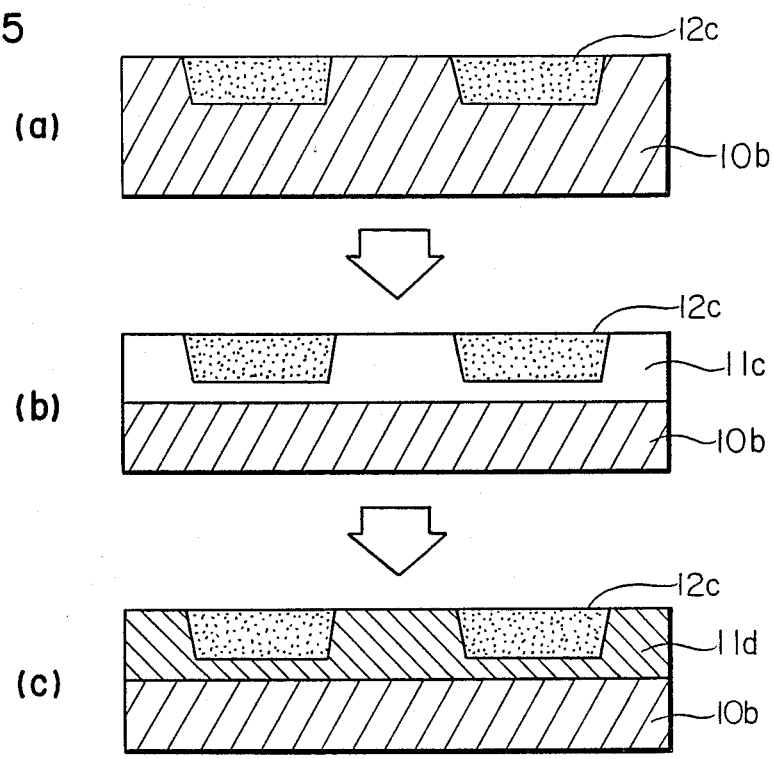
FIG. 5 is a sectional view of the essential parts for explaining the processes of forming a semiconductor device according to the present invention by use of the FIPOS process.
Figure 6:
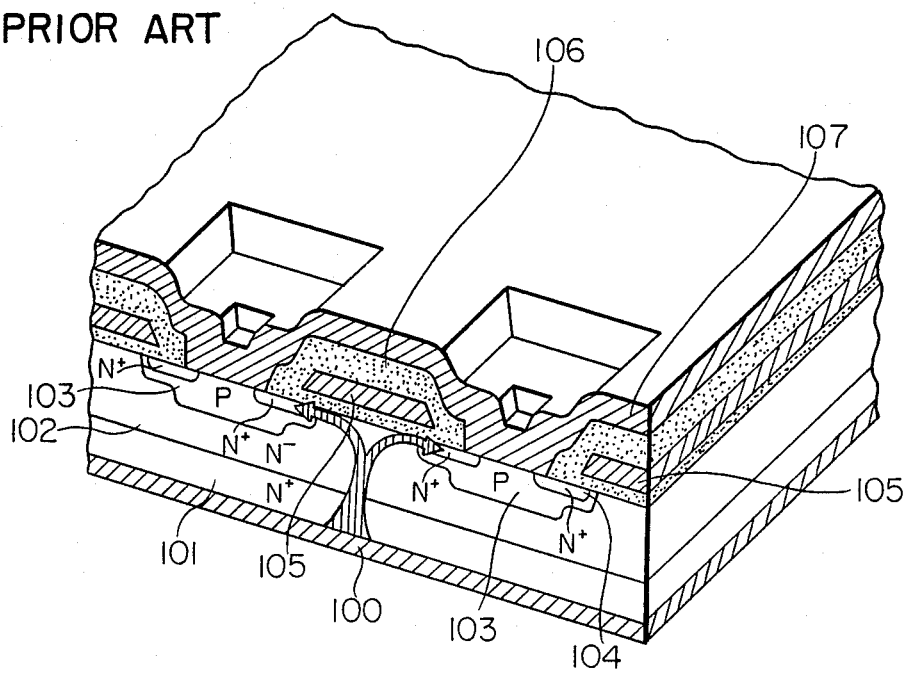
FIG. 6 is a perspective sectional view of a DMOS formed on a conventional semiconductor device.

A sectional view of the essential parts in the process of forming a semiconductor device by FIPOS is shown in FIG. 5. As shown in FIG. 5(a), after a diffusion region 12c of N conduction type is formed on the main surface in the silicon single-crystal substrate 10b of P conduction type, anodization is effected in the manner shown in FIG. 5(b) thereby to selectively convert only the P-type region to a porous layer 11c in the silicon single-crystal substrate 10b. Under this condition, as shown in FIG. 5(c), the porous layer 11c alone is selectively oxidized thereby to form a silicon oxide layer 11d. In the process, the depth of the silicon oxide layer 11d is set to such a degree than the diffusion region 2c is electrically isolated from the silicon single-crystal substrate 10b which is a base. In the same manner as in the aforementioned embodiment, a metal silicide layer, an epitaxial layer or the like are formed on the diffusion region 12c thereby to construct a semiconductor device.

In the present invention, the semiconductor elements formed in and on the semiconductor epitaxial layer are not limited to DMOS or MOS transistor, but may include any semiconductor elements such as bipolar transistor or static induction transistor (SIT) requiring a back electrode. On the other hand, power for a control circuit may be supplied by forming a solar cell on the same semiconductor single-crystal substrate.

A ceramic substrate or the like instead of a silicon single-crystal substrate may be used as a substrate 10 for the present invention. In such a case, an insulation film is formed on the main surface of a ceramic substrate, and a polycrystal silicon layer is formed partially on the insulation film. And the polycrystal silicon layer is recrystallized by heat treatment, following by forming a metal silicide layer thereon.

It will thus be understood from the foregoing description that according to the present invention, there is provided a semiconductor device wherein a plurality of semiconductor elements are formed in spaced relations on respective insulation layers in and on a semiconductor epitaxial layer and therefore are completely isolated electrically from each other. Also, independent semiconductor intermetallic compound layers are used for the semiconductors as an electrode, so that the potentials thereof may be determined as desired. As a result, both N-DMOS and P-DMOS are capable of being formed on the same semiconductor single-crystal substrate. In addition, a superior advantage is obtained that it is possible to provide a reliable semiconductor device free of latch-up and with a reduced leak current.

I claim:

1. A semiconductor device comprising:
    a substrate having a main surface;
    a plurality of semiconductor single-crystal layers in spatially isolated relationship from each other which are formed on the main surface of the substrate;
    an insulation layer between said substrate and each of said semiconductor single-crystal layers;
    a plurality of single-crystal semiconductor intermetallic compound layers formed respectively on the semiconductor single-crystal layers and used as electrodes for semiconductor elements;
    a plurality of semiconductor epitaxial layers respectively formed on part of the semiconductor intermetallic compound layers, each said semiconductor epitaxial layer being used as an active layer of a semiconductor element;
    first wiring means respectively connected electrically to each of the semiconductor epitaxial layers; and
    second wiring means respectively connected electrically to each of the single-crystal semiconductor intermetallic compound layers by being in contact with a part of the surface of said single crystal semiconductor intermetallic compound layer on which the semiconductor epitaxial layer is not formed.

2. A semiconductor device according to claim 1, wherein the substrate includes a semiconductor single-crystal substrate, and the insulation layer includes an oxide layer formed by oxidizing a predetermined region of the substrate.

3. A semiconductor deice according to claim 1, wherein some of the semiconductor elements have a vertical current path in the semiconductor epitaxial layer thereof.

4. A semiconductor device according to claim 1, wherein some of the semiconductor elements have a horizontal current path in the semiconductor epitaxial layer thereof.

5. A semiconductor device according to claim 1, wherein a semiconductor element with a semiconductor epitaxial layer of N conduction type and a semiconductor element with a semiconductor epitaxial layer of P conduction type are disposed on the same substrate.

6. A semiconductor device comprising:
a substrate formed of silicon, having a main surface;
a plurality of silicon single-crystal layer means, spatially isolated from each other, formed on the main surface of the substrate;
an oxide layer, between said silicon single-crystal layer means and said substrate;
single-crystal semiconductor intermetallic compound layer means, formed on each of the silicon single-crystal layer means respectively;
semiconductor epitaxial layer means formed on part of the semiconductor intermetallic compound layer means, the semiconductor epitaxial layer means being a type selected form the group consisting of N and P conduction types;
first wiring means connected electrically to the semiconductor epitaxial layer means; and
second wiring means connected electrically to the single-crystal semiconductor intermetallic compound layer means by being in contact with a part of the surface of said semiconductor intermetallic compound layer means on which the semiconductor epitaxial layer means is not formed.

7. A semiconductor device comprising:
a substrate having a main surface;
an insulation layer on the main surface of the substrate;
a semiconductor single-crystal layer formed on part of the insulation layer;
a single-crystal semiconductor intermetallic compound layer formed on the semiconductor single-crystal layer and used as an electrode of a semiconductor element;
a semiconductor epitaxial layer formed on part of the semiconductor intermetallic compound layer to be used as an active layer for the semiconductor element;
first wiring means connected electrically to the semiconductor epitaxial layer; and
second wiring means connected electrically to the single-crystal semiconductor intermetallic compound layer by being in contact with a part of the surface of said semiconductor intermetallic compound layer on which the semiconductor epitaxial layer is not formed.

8. A semiconductor device according to claim 7, wherein the substrate includes a semiconductor single-crystal substrate, and the insulation layer includes an oxide layer formed by oxidizing a predetermined region in the semiconductor single-crystal substrate.

9. A semiconductor device according to claim 7, wherein the semiconductor element formed in and on the semiconductor epitaxial layer a has a vertical current path in the semiconductor epitaxial layer.

10. A semiconductor device according to claim 7, wherein a semiconductor element with a semiconductor epitaxial layer of N conduction type and a semiconductor element with a semiconductor epitaxial layer of P conduction type are formed on the same substrate.

11. A semiconductor device comprising:
a substrate made of silicon having a main surface;
an oxide layer on said substrate;
a silicon single-crystal layer formed on a part of the main surface of the substrate with said oxide layer therebetween;
a single-crystal semiconductor intermetallic compound layer formed on the silicon single-crystal layer;
a semiconductor epitaxial layer formed partially on the semiconductor intermetallic compound layer and used as an active layer of a semiconductor element having a vertical current path, the semiconductor epitaxial layer selected from the group consisting of N and P conduction types;
first wiring means connected electrically to the semiconductor epitaxial layer; an
second wiring means connected electrically to the single-crystal semiconductor intermetallic compound layers by being in contact with a part of the surface of said semiconductor intermetallic layer surface on which the semiconductor epitaxial layer is not formed.

12. A semiconductor device Comprising:
a silicon single-crystal substrate having a main surface;
a buried silicon oxide layer disposed on part of the silicon single-crystal substrate so that a silicon ingle-crystal area of a predetermined shape is left on the main surface;
a silicon single-crystal layer disposed on a whole surface of the silicon single-crystal are a of the predetermined shape;
a single-crystal silicide layer, said layer using the silicon single-crystal layer patterned on the predetermined shape as a seed material to transform the single-crystal silicide layer into plural single-crystal silicide layers, the single-crystal silicide layers being respectively used as electrodes of a semiconductor element having a vertical current path;
first conduction type silicon epitaxial layers, each said layer partially using the single-crystal silicide layers respectively used as a seed material, which become respectively an active layer for a semiconductor element, and at least one of the first conduction type silicon epitaxial layers including the semiconductor element having the vertical current path;
second conduction type silicon epitaxial layers partially disposed on areas excepting areas on which the first conduction type silicon epitaxial layers are disposed, by using the single-crystal single-crystal silicide layers respectively used as a seed material, and the second conduction type silicon epitaxial layers becoming respectively an active layer for a semiconductor element;
first wiring means respectively connected electrically to each of the first and second conduction type silicon epitaxial layers; and
second wiring means respectively electrically connected to each of the single-crystal silicide layers.

13. A semiconductor device according to claim 12 wherein the single-crystal silicide layer is perfectly single-crystallized on the whole main surface of the silicon signle-crystal substrate by a process of converting a silicide forming metal film or silicide film into an amorphous state and thereafter heat treating the amorphous silicide forming metal film or silicide film.

* * * * *